United States Patent [19]
Walburn et al.

[11] Patent Number: 5,241,451
[45] Date of Patent: Aug. 31, 1993

[54] MODULAR ELECTRONIC ASSEMBLIES USING COMPRESSIBLE ELECTRICAL CONNECTORS

[75] Inventors: Douglas M. Walburn, Harrisburg, Pa.; Keith L. Volz, Jamestown; Robert M. Renn, Pfafftown, both of N.C.

[73] Assignee: The Whitaker Corporation, Wilmington, Del.

[21] Appl. No.: 939,285

[22] Filed: Sep. 1, 1992

[51] Int. Cl.⁵ .............................. H05K 7/20
[52] U.S. Cl. ............................ 361/785; 24/453; 248/221.4; 361/721; 403/408.1
[58] Field of Search ............. 174/252, 138 D, 138 G; 439/485, 61, 65, 66, 74, 95; 361/386–389, 412, 400, 413, 417, 419, 420; 24/297, 453, 458, 335, 336, 618; 403/408.1; 411/55, 60, 508; 248/27.3, 73, 221.4, 239

[56] References Cited

U.S. PATENT DOCUMENTS

| | | | |
|---|---|---|---|
| 4,635,326 | 1/1987 | Yagi | 24/453 |
| 4,697,858 | 10/1987 | Balakrishnan | 439/61 |
| 4,970,761 | 11/1990 | Nakamura | 24/453 |
| 5,104,339 | 4/1992 | Verhoeven | 439/567 |
| 5,138,529 | 8/1992 | Colton | 361/424 |
| 5,155,661 | 10/1992 | Nagesh | 361/386 |

Primary Examiner—Gerald P. Tolin

[57] ABSTRACT

A molded connector housing (10) has respective pairs of integrally-molded latching fingers (18,20,21) for quick assembly to respective mother and daughter boards (11,12). A locking plunger (25) is received between the pairs of latching fingers (18,20,21) to secure the assembly. The plunger (25) may also be used with an axially-compressible fastener or grommet (43). In lieu of the latching fingers, an integrally-molded fastener (50) cooperates with a conical nut (52) having circumferentially-spaced ears (53) slidably received in slots (51) in the fastener.

19 Claims, 14 Drawing Sheets

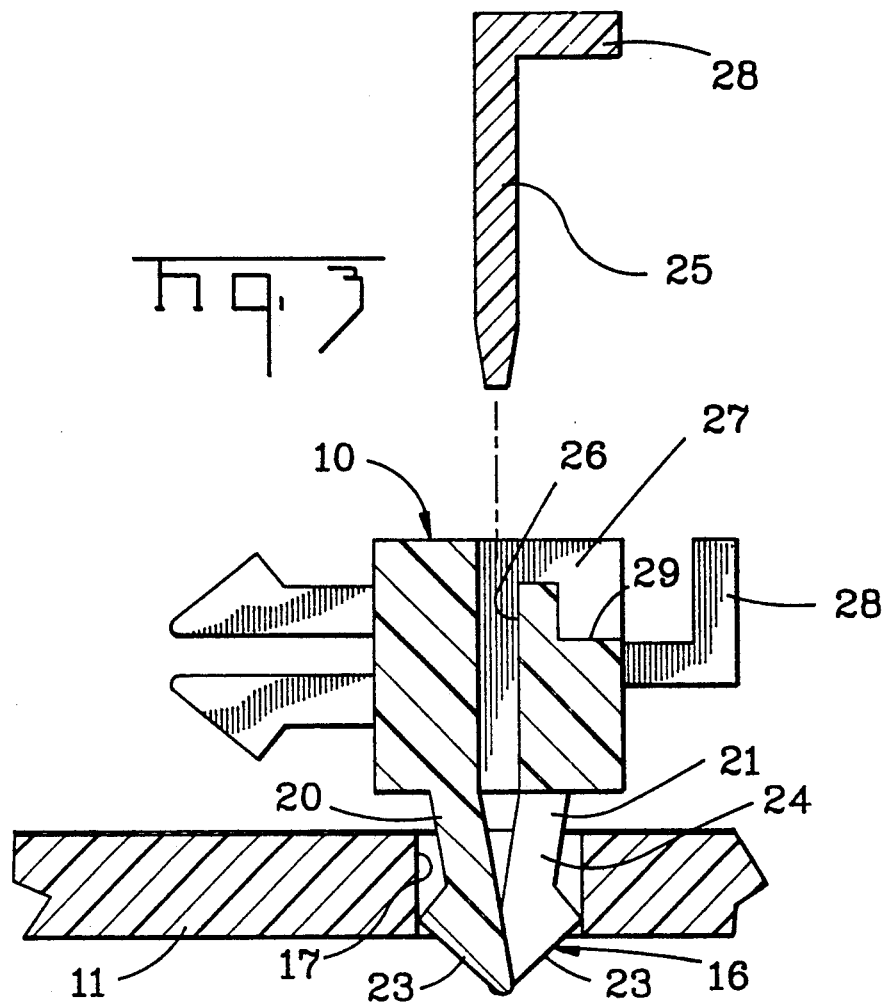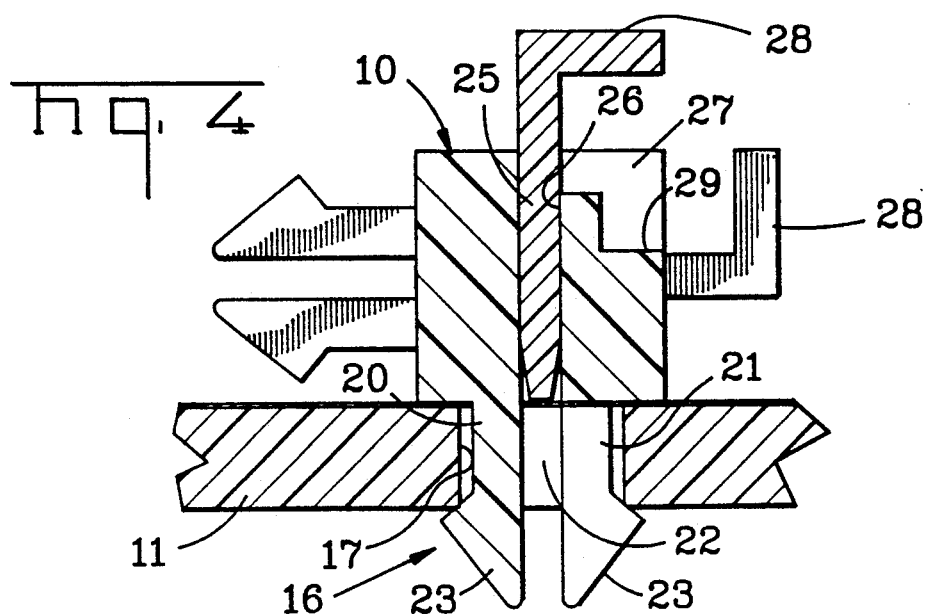

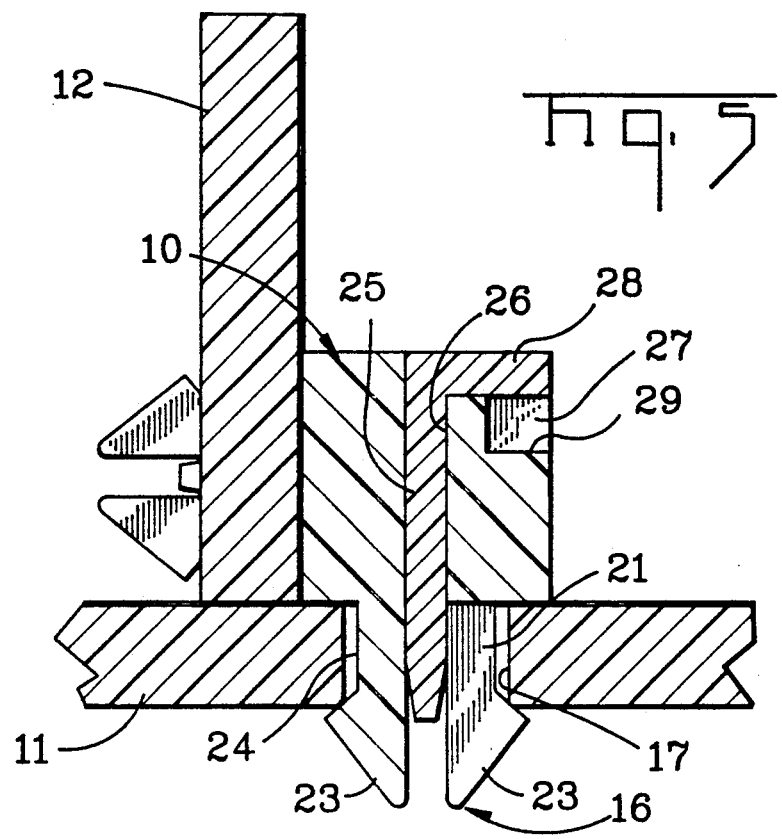
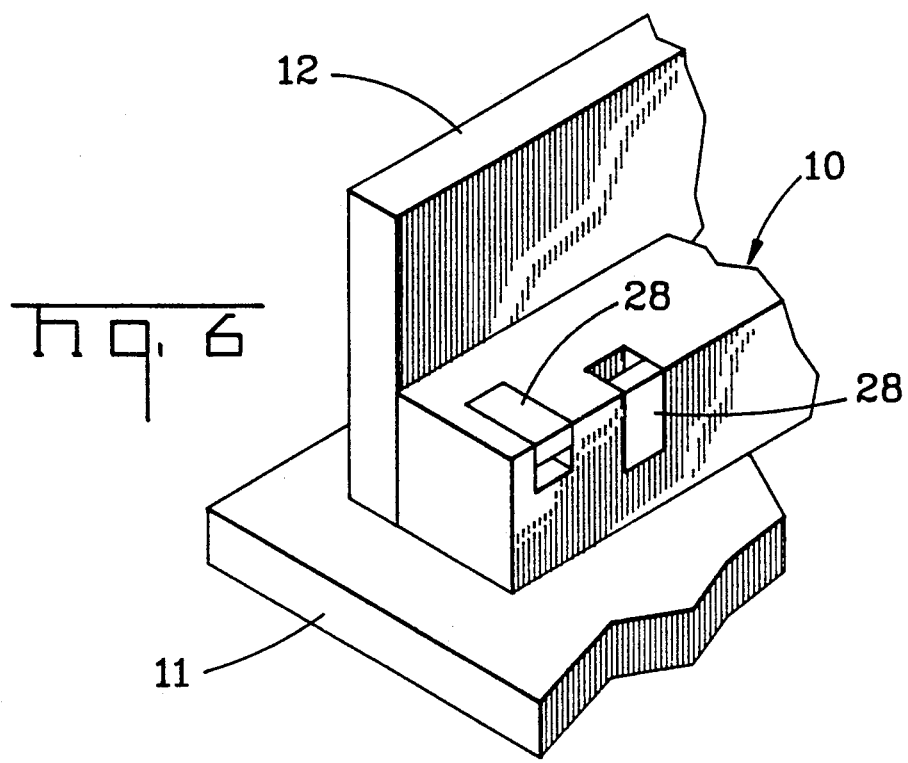

MODULAR ELECTRONIC ASSEMBLIES USING COMPRESSIBLE ELECTRICAL CONNECTORS

The present invention relates to modular electronic assemblies, and more particularly, to mother and daughter board configurations having one or more compressible electrical connectors electrically connecting respective circuit elements on the mother and daughter boards, respectively.

BACKGROUND OF THE INVENTION

A mother board and one or more daughter boards are used to transfer digital signals between respective assemblies used in a computer or other electronic equipment. The mother and daughter boards may be arranged perpendicular to each other, as in an "edge card" configuration, or parallel to each other in a "stacking" arrangement, depending upon the design of the overall product.

For product applications involving high circuit densities in a confined space, flexible compressible electrical connectors are used to connect respective circuit elements on the mother and daughter boards. These compressible electrical connectors include a plurality of closely-spaced conductive elements or traces photographically etched or otherwise formed on a flexible film which is bonded to an elastomeric core or other suitable carrier. Under its trademark "AMPLIFLEX", AMP Incorporated of Harrisburg, Pa., supplies a wide variety of such compressible electrical connectors to the electronic and aerospace industries.

In these product applications, it is important to substantially reduce the assembly time of the components in production, as well as to facilitate the disassembly of the components in servicing the equipment purchased by customers.

SUMMARY OF THE INVENTION

The present invention facilitates assembly of the components in production as well as disassembly of the components for maintenance and repair. A modular design concept is utilized to quickly provide a number of molded connector housings for a variety of compressible electrical conductors, thereby providing a degree of standardization and inventory control. As a result, the demands of equipment manufacturers are readily met with a minimum of production engineering and tooling changes, thereby reducing costs and shortening the development cycle.

The invention is applicable to an electronic assembly including a mother board having at least one circuit element thereon and further including a daughter board having at least one circuit element thereon. A molded connector housing is disposed between the mother and daughter boards, and a compressible electrical connector within the molded connector housing electrically connect the respective circuit elements on the mother and daughter boards, respectively. The mother board has at least one mounting hole formed therein, and the daughter board has at least one mounting hole formed therein.

In accordance with the teachings of the invention, a means is provided for snapping the molded connector housing on to the mother and daughter boards, respectively. Preferably, this means includes at least two pairs of latching fingers integrally molded with the molded connector housing and received within the respective mounting holes in the mother and daughter boards, respectively.

In accordance with the further teachings of the invention, the molded connector housing has an opening formed therein in communication with a space between the first and second fingers on each pair of latching fingers, and a locking plunger is received within the opening in the molded connector housing and into the space between the first and second fingers.

These and other objects of the present invention will become apparent from a reading of the following specification taken in conjunction with the enclosed drawings.

BRIEF DESCRIPTION OF THE DRAWINGS

FIG. 3 is a cross-sectional view of the components of FIG. 1 in their pre-assembled relationship, showing a pair of latching fingers being inserted in one of the boards (in this case, the mother board) and further showing how the inclined forward surfaces of the respective fingers engage the mounting hole in the mother board to cam the fingers inwardly towards each other.

FIG. 4 is a further cross-sectional view, corresponding substantially to that of FIG. 3, but showing the inclined surfaces on the respective fingers clear of the mounting hole, and further showing a locking plunger partially inserted within an opening in the molded connector housing.

FIG. 5 is a still further cross-sectional view, corresponding substantially to that of FIG. 4, but showing the plunger fully depressed and seated on the molded connector housing, such that the plunger fully spreads the fingers apart and locks the pair of latching fingers within the mounting hole, the mounting hole being received in respective notches on the fingers.

FIG. 6 is a further perspective, corresponding to FIG. 2, but showing the locking plungers fully seated within the molded connector housing.

GENERAL DESCRIPTION OF THE PREFERRED EMBODIMENT

Figure 1:
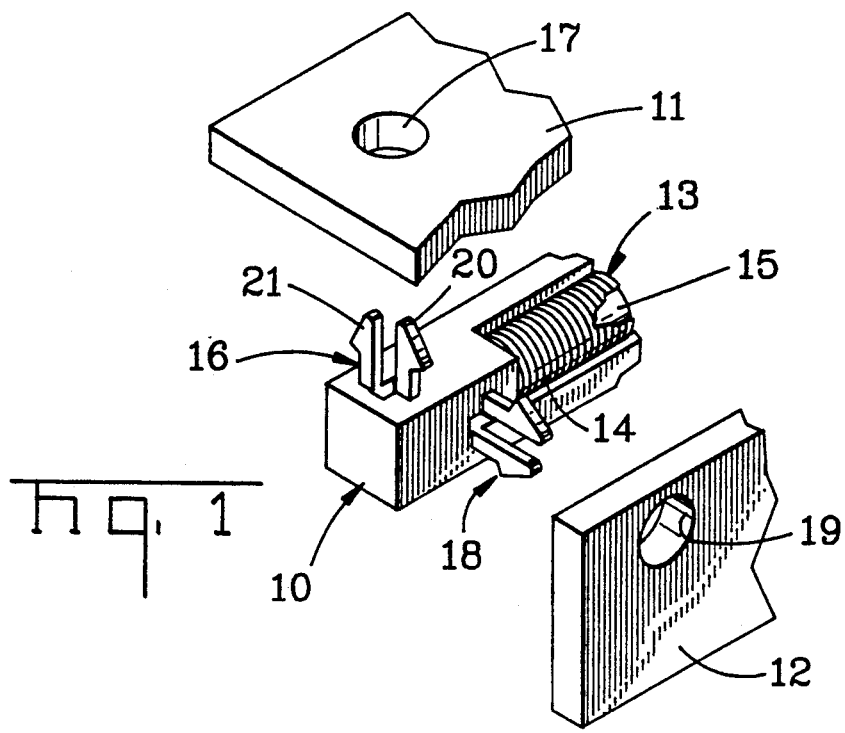
FIG. 1 is an exploded perspective of one embodiment of the present invention, showing a molded connector housing having respective pairs of integrally-molded latching fingers to be received in corresponding mounting holes in a mother board and daughter board, respectively, the boards being arranged at a right angle with respect to each other in an edge card configuration.
Figure 2:
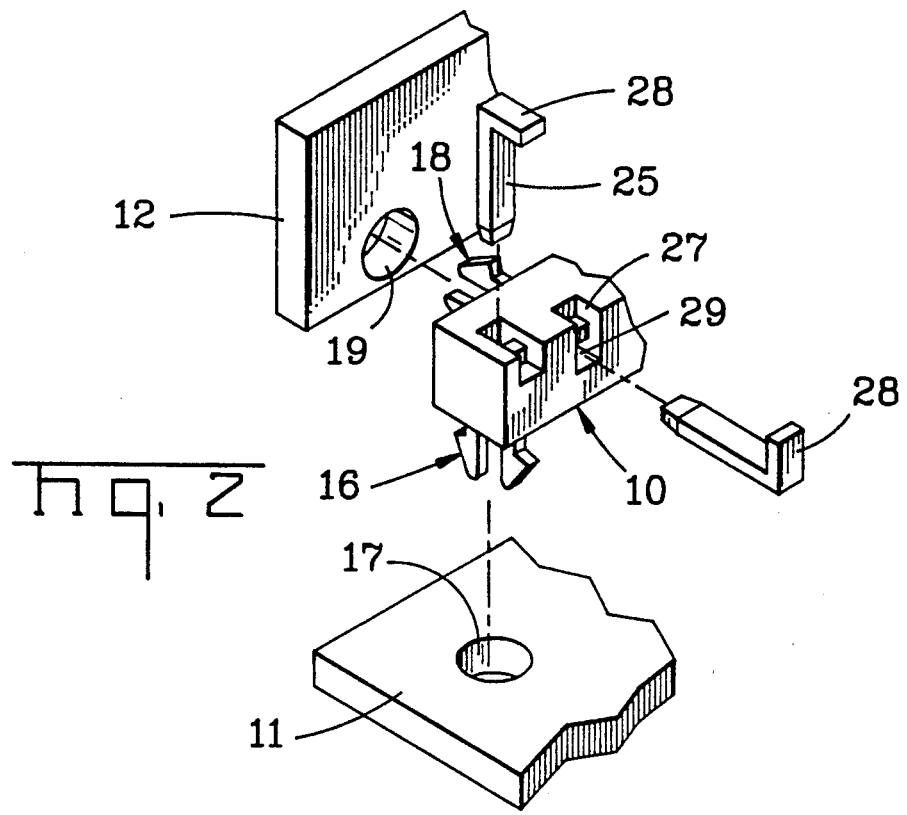
FIG. 2 is an exploded perspective, corresponding substantially to that of FIG. 1, but further showing a locking plunger for each pair of latching fingers.

With reference to FIGS. 1–6, a molded connector housing 10 is disposed between a mother board 11 and a daughter board 12 arranged perpendicularly of each other in an "edge card" configuration. One or more compressible electrical connectors 13 are housed Within the molded connector housing 10 for making electrical connection between respective circuit elements (now shown) on the mother board 11 and daughter board 12, respectively. The compressible electrical connector 13 includes a thin flexible film 14 bonded to an elastomeric core 15. Further details of the compressible electrical connector 13 being conventional, have been omitted for ease of illustration.

A first pair of latching fingers 16 is integrally molded with the molded connector housing 10 for engagement with a mounting hole 17 in the mother board 11, and a second pair of latching fingers 18 is integrally molded with the molded connector housing 10 for engagement with a mounting hole 19 in the daughter board 12. Preferably, the pairs of latching fingers 16 and 18 are laterally offset with respect to each other, longitudinally of the molded connector housing 10.

Each of the pairs of latching fingers 16 and 18 includes complementary first and second fingers, 20 and 21, respectively, separated from each other and defining a space 22 therebetween. Preferably, the fingers 20 and 21 are also laterally offset with respect to each other, longitudinally of the molded connector housing 10.

Each finger has a forward portion provided with an inclined surface 23 and further provided with a notch 24 rearwardly of its respective inclined surface 23. These respective inclined surfaces 23 are directed opposite to each other and are disposed in respective planes defining therebetween a dihedral angle which converges in the direction of the respective board.

When the molded connector housing 10 is secured by a "snap" action to one of the boards, such as the mother board 11 shown in FIGS. 3–5, the first pair of latching fingers 16 enters its respective mounting hole 17; and the inclined surfaces 23 on the first finger 20 and second finger 21 engage the mounting hole 17 (FIG. 3) thereby camming the first and second fingers 20, 21 inwardly towards each other. As the respective inclined surfaces 23 on the first and second fingers 20, 21 pass through the respective mounting hole 17, the fingers 20, 21 snap back into their normal position (FIG. 4) such that the respective mounting hole 17 is received within the respective notches 24 in the first and second fingers 20, 21 to thereby latch the molded connector housing 10 to the mother board 11 (or other board).

A locking plunger 25 is received in an opening 26 formed in the molded connector housing 10 and into the space 22 between the fingers 20, 21, thereby locking the fingers 20, 21 and precluding inadvertent disassembly. The molded connector housing 10 further has an access opening 27 formed therein at a right angle to the opening 26 for the locking plunger 25, and the locking plunger 25 has a right-angularly bent portion 28 received in the access opening 27 in the molded connector housing 20. The molded connector housing 10 further has an undercut 29 therein in communication with the access opening 27, and a tool (not shown) may be inserted into the undercut 29 to engage the right-angularly bent portion 28 of the locking plunger 25 to lift the locking plunger 25 out of the molded connector housing 10.

Figure 7:
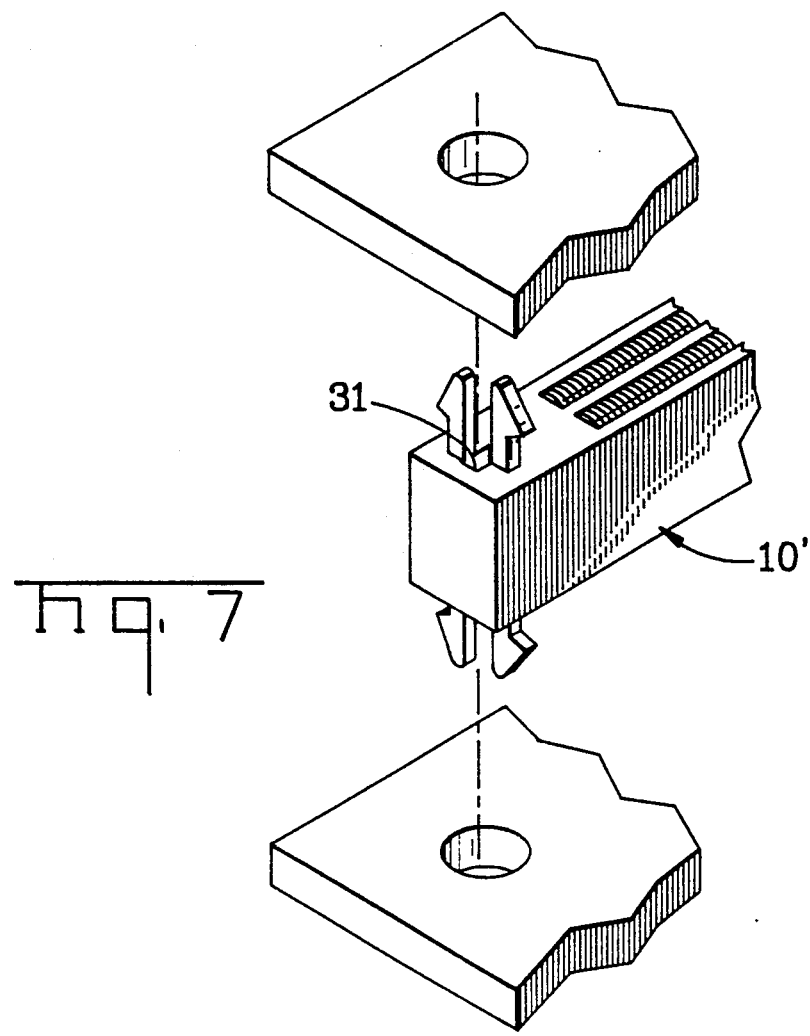
FIG. 7 is an exploded perspective of another embodiment of the invention, showing the molded connector housing between parallel printed circuit boards in a stacking configuration, and further showing the pairs of latching fingers at substantially 180 degrees with respect to each other.
Figure 8:
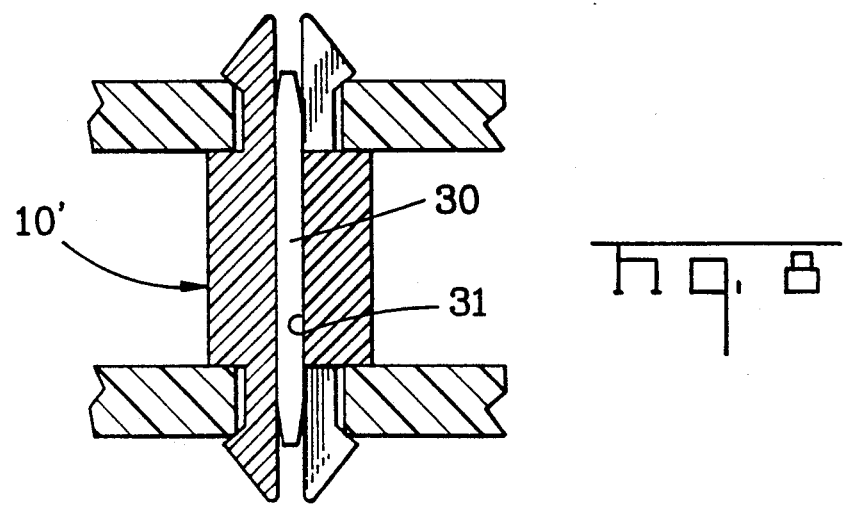
FIG. 8 is a cross-sectional view of the components of FIG. 7 in their assembled relationship, and further showing a single locking plunger within an opening in the molded connector housing, the single locking plunger being used for both pairs of latching fingers.

With reference to FIGS. 7 and 8, the mother board 11 and daughter board 12 are substantially parallel to each other in a "stacking" configuration, and the respective pairs of latching fingers 16, 18 are disposed substantially at 180° with respect to each other (rather than at 90° to each other as in FIGS. 1-6). In this configuration, a single locking plunger 30 is received in an opening 31 in the molded connector body or housing 10', thereby locking the latching fingers 16, 18.

Figure 9:
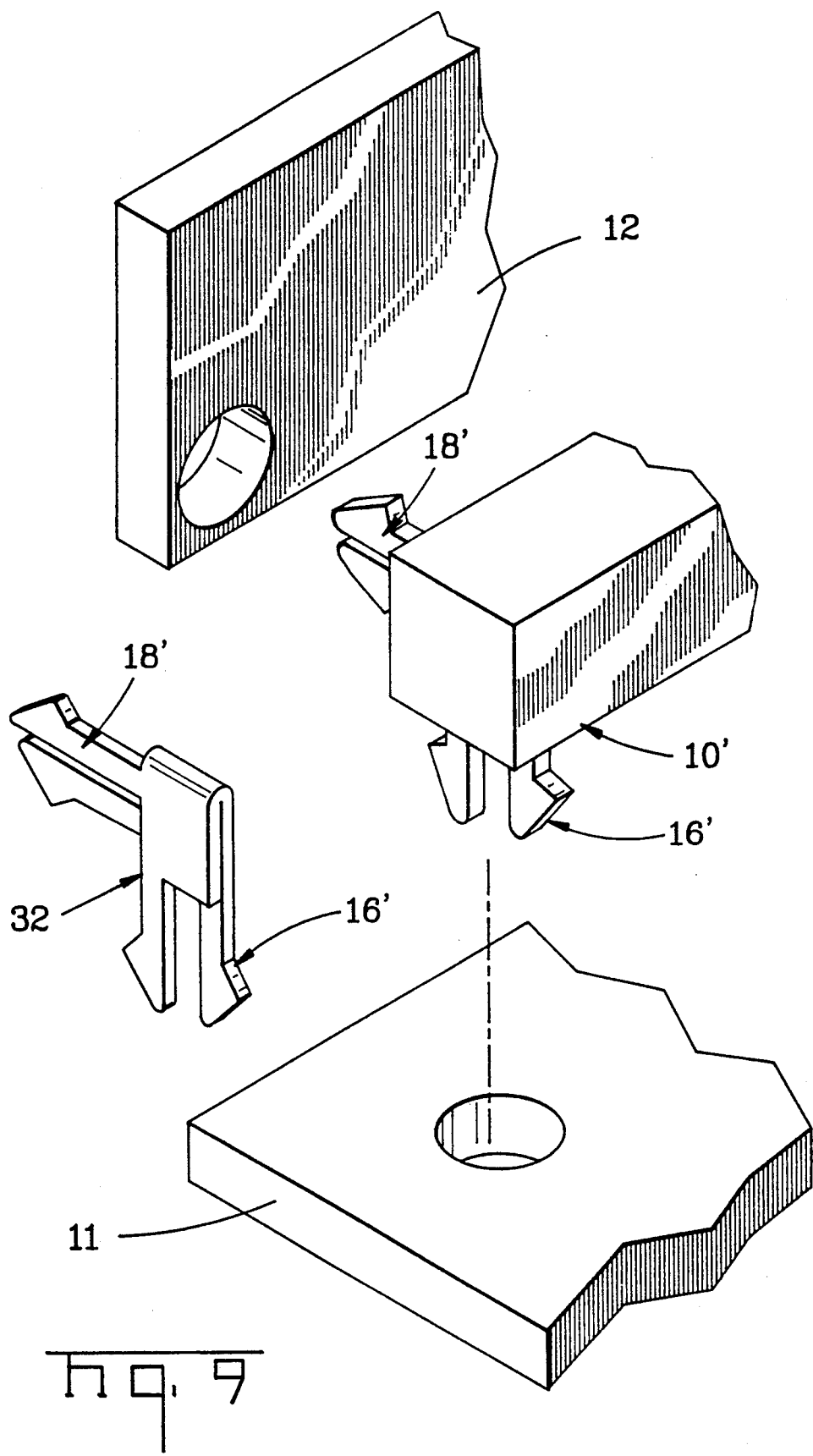
FIG. 9 is an exploded perspective of another embodiment, wherein the latching fingers are made of a suitable metal and are insert molded within the molded connector housing for providing conductivity between respective heat sinks or ground planes on the respective mother and daughter boards.
Figure 10:
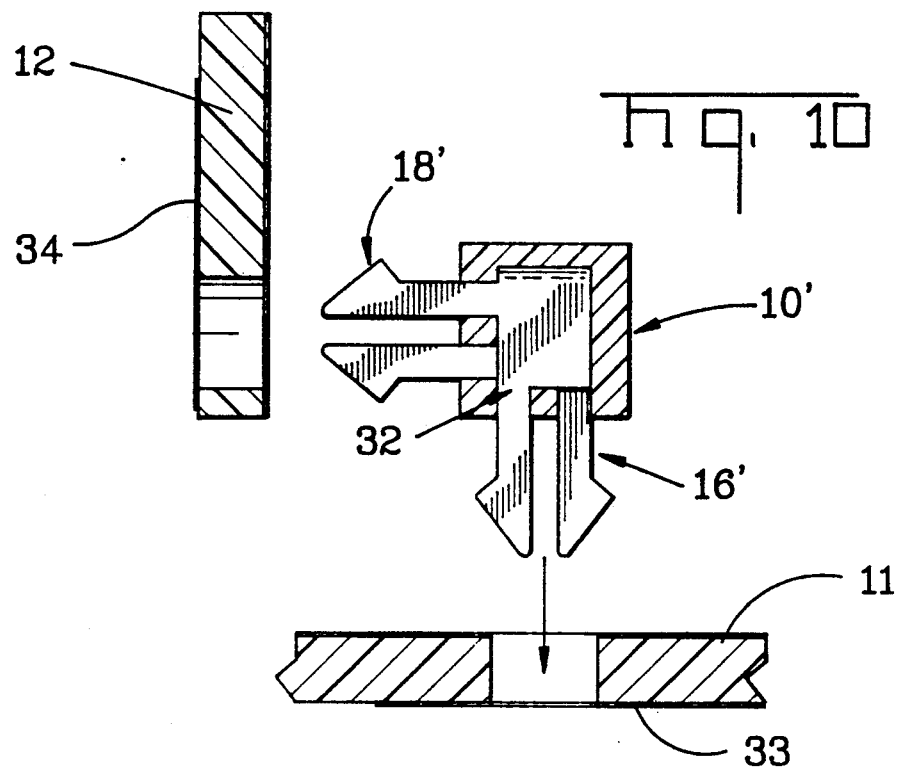
FIG. 10 is a cross-sectional view of the components of FIG. 9 in their pre-assembled relationship.
Figure 11:
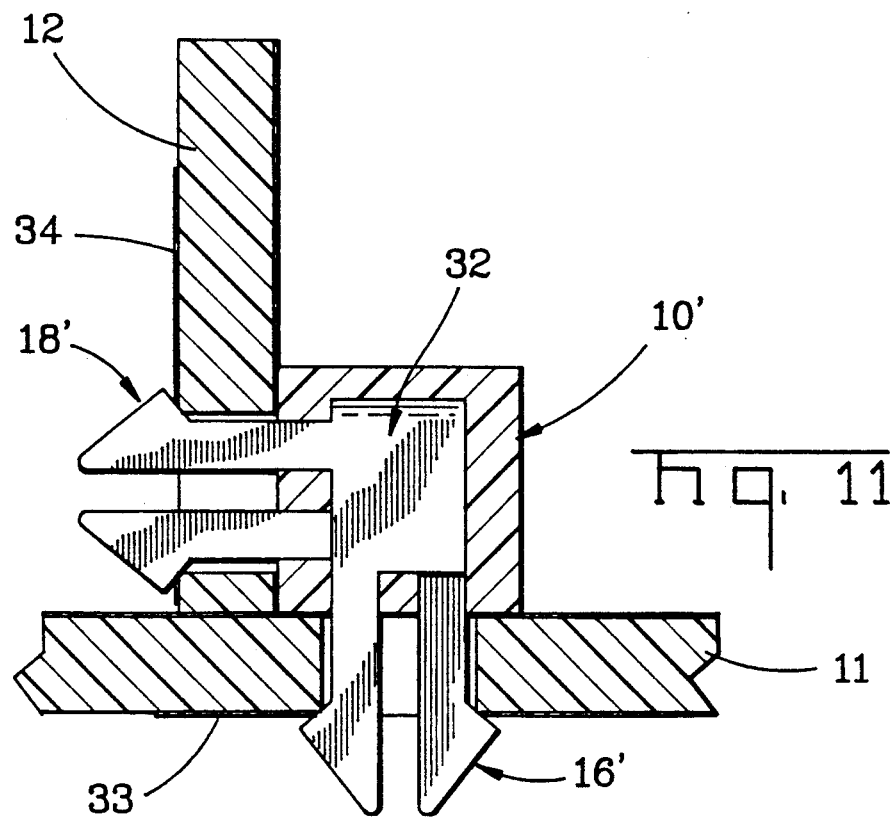
FIG. 11 is a further cross-sectional view, corresponding substantially to that of FIG. 10, but showing the components of FIG. 9 in their assembled relationship.

With reference to FIGS. 9-11, a metal latching fingers insert 32 is integrally molded in the molded connector housing 10". The metal latching fingers insert 32 contacts (and thus "bridges") respective heat sinks (or ground planes) 33 and 34 on the mother board 11 and daughter board 12, respectively.

In printed circuit boards, heat sinks are usually of metal (but not necessarily) and ground planes are electrically conductive. As shown in FIGS. 9-11, the metal latching fingers insert 32 has right-angularly disposed pairs of latching fingers 16' and 18', respectively, although an in-line configuration is equally feasible.

Figure 12:
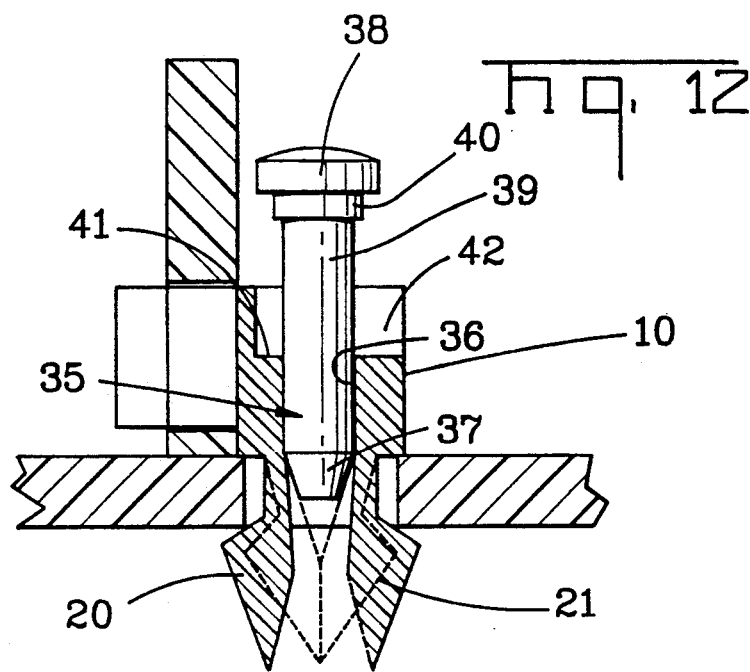
FIG. 12 is a cross-sectional view, corresponding substantially to that of FIG. 4, but showing an alternate plunger.
Figure 13:
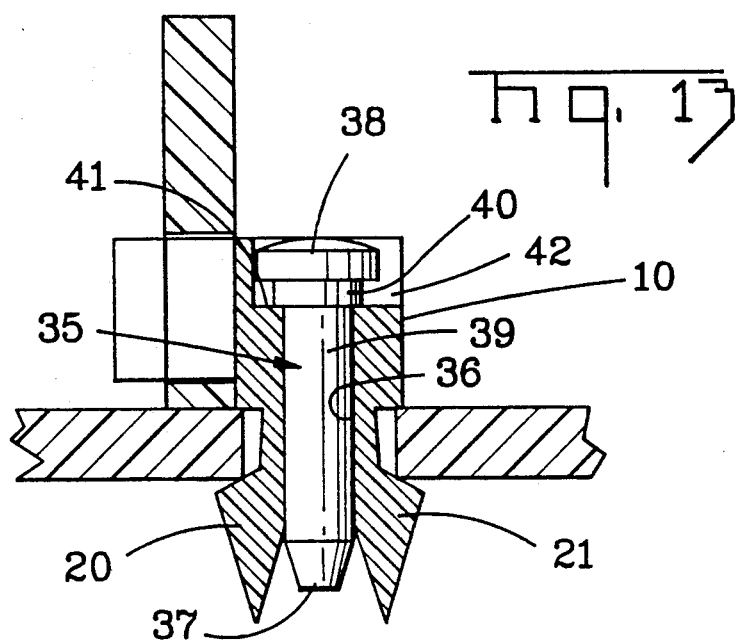
FIG. 13 is a further cross-sectional view, corresponding to that of FIG. 12, but showing the plunger fully seated to spread apart the pair of latching fingers.

With reference to FIGS. 12 and 13, a plunger 35 is received in an opening 36 in the molded connector housing 10. The plunger 35 having a conical tip 37, such that the plunger 35 may be depressed to engage and spread the first and second fingers 20, 21 apart. The plunger 35 further has an enlarged head 38, a stem 39 slidably received in the opening 36 in the molded connector housing 10, and a collar 40 between the enlarged head 38 and the stem 39. The molded connector housing 10 further has a ledge 4 upon which the collar 40 of the plunger 35 rests when the plunger 35 is depressed, thereby limiting the movement of the plunger 35. An access opening 42 is formed in the molded connector housing 10 adjacent to the ledge 41, such that a tool (now shown) may be inserted into the access opening 42 and beneath the enlarged head 38 of the plunger 35 to lift the plunger 35 out of the molded connector housing 10.

Figure 14:
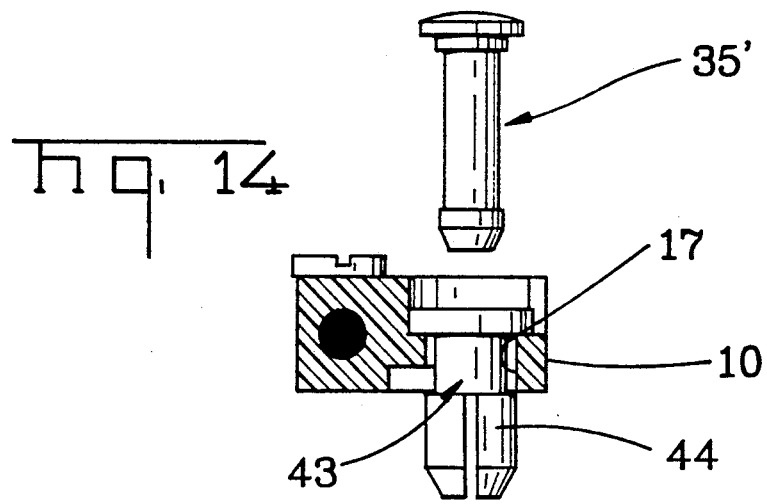
FIG. 14 is a cross-sectional view of another embodiment, showing a grommet inserted into the molded connector housing (or body), and further showing a plunger in exploded relationship to the grommet.
Figure 15:
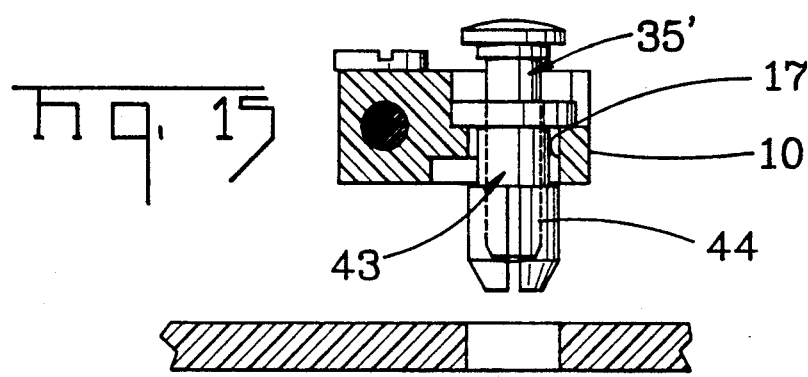
FIG. 15 is a further cross-sectional view, corresponding substantially to that of FIG. 14, but showing the plunger partially seated within the grommet, and further showing a board in exploded relationship to the grommet.
Figure 16:
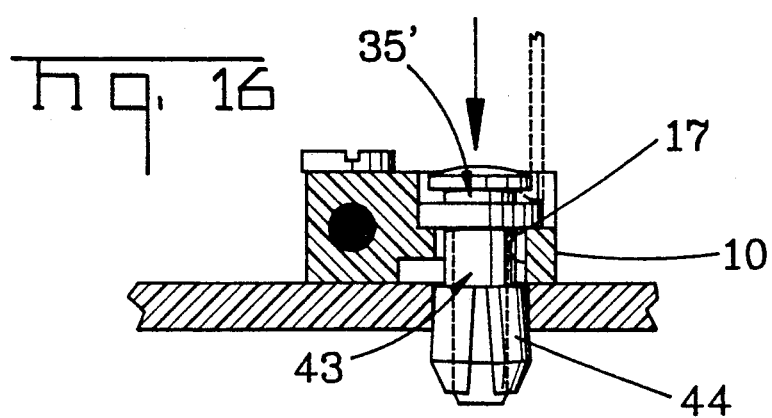
FIG. 16 is a still further cross-sectional view, corresponding substantially to that of FIG. 15, but showing the grommet fully seated, thereby securing the board to the molded connector housing.
Figure 17:
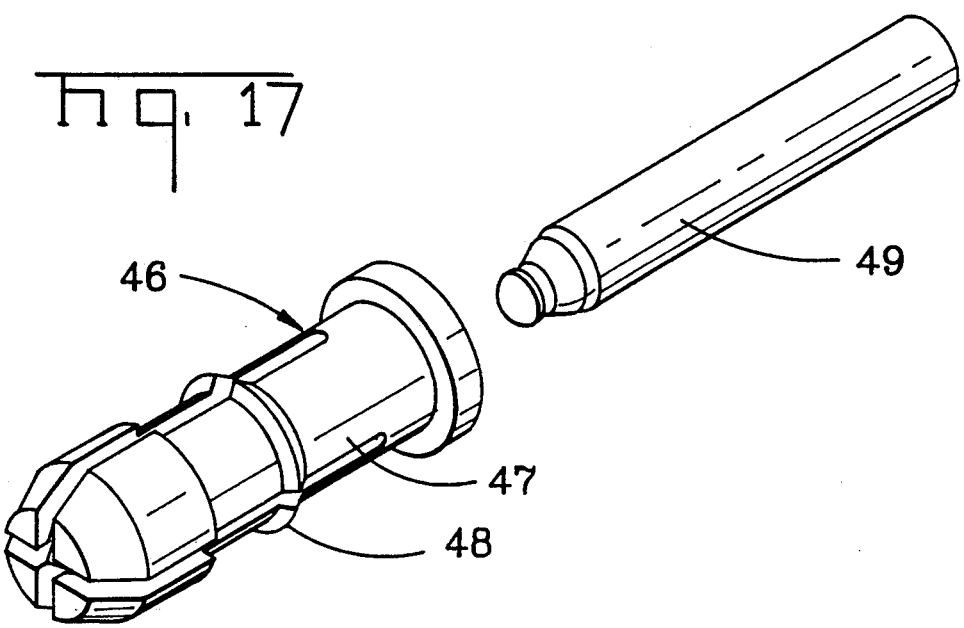
FIG. 17 is an exploded perspective of an alternate grommet and its plunger.
Figure 18:
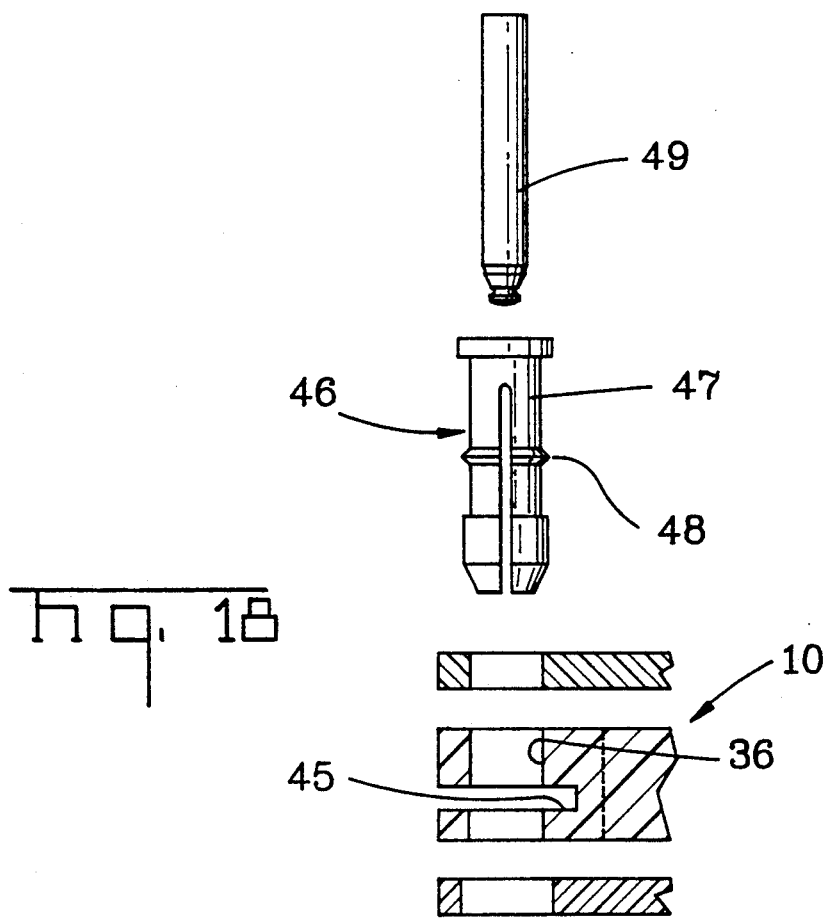
FIG. 18 is an elevational view of the grommet and plunger of FIG. 17 in exploded relationship to a molded connector housing sandwiched between a pair of printed circuit boards.
Figure 19:
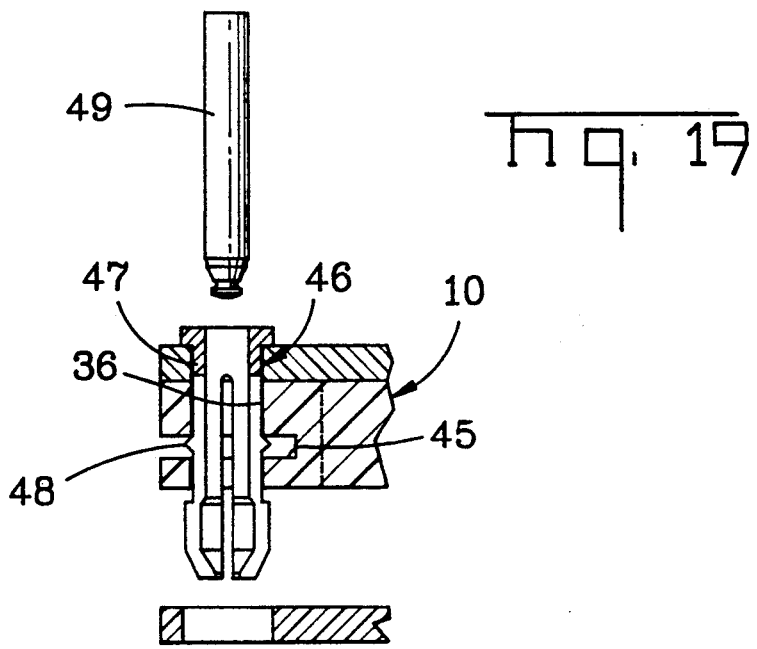
FIG. 19 is a further elevational view of the components of FIG. 18, but showing the grommet received in a mounting hole in one of the boards and extending through an opening in the molded connector housing.
Figure 20:
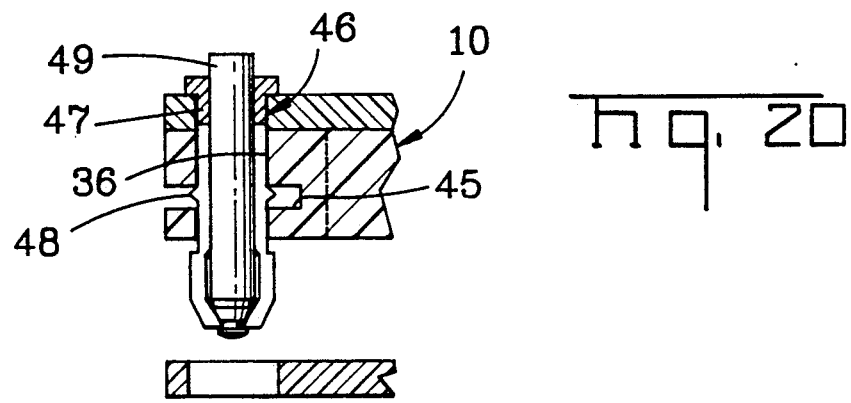
FIG. 20 is a further elevational view, corresponding to FIG. 19, but showing the plunger partially seated within the grommet.
Figure 21:
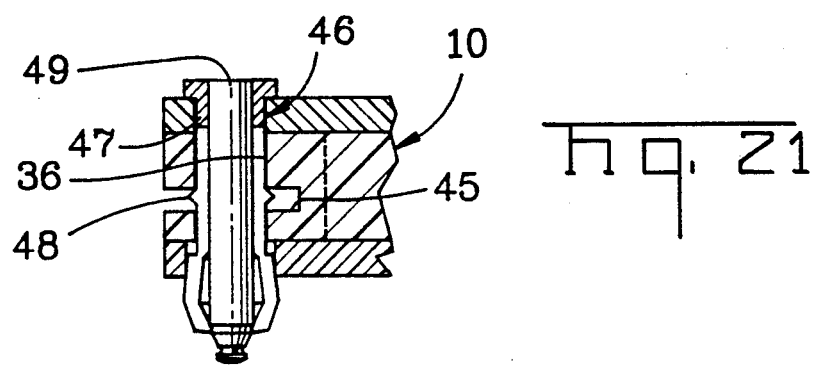
FIG. 21 is a still further elevational view, corresponding to FIG. 19, but showing the plunger fully seated to spread apart the grommet to secure the overall assembly.

With reference to FIGS. 14-16, an axially-compressible grommet 43 is carried by the molded connector body 10 and is received in the mounting hole 17 in board 11 (or board 12). The grommet 43 has a forward slotted portion 44 extending beyond the mounting hole 17 in the board 11, and a plunger 35' may be depressed relative to the grommet 43 to compress the grommet 43 axially and draw the forward slotted portion 44 of the grommet 43 up against the board 11.

With reference to FIGS. 18-21, the molded connector housing 10 has a slotted recess 45 formed therein transversely of the opening 36 and in communication therewith. A grommet 46 has a body portion 47 received in the opening 36, and the body portion 47 has an intermediate section provided with an annular protrusion 48 received within the transversely-slotted recess 45, thereby positioning the grommet 46 in the molded connector body 10 prior to final assembly. A plunger 49 is then seated within the grommet 46 to axially compress the grommet 46 and secure the assembly.

Figure 22:
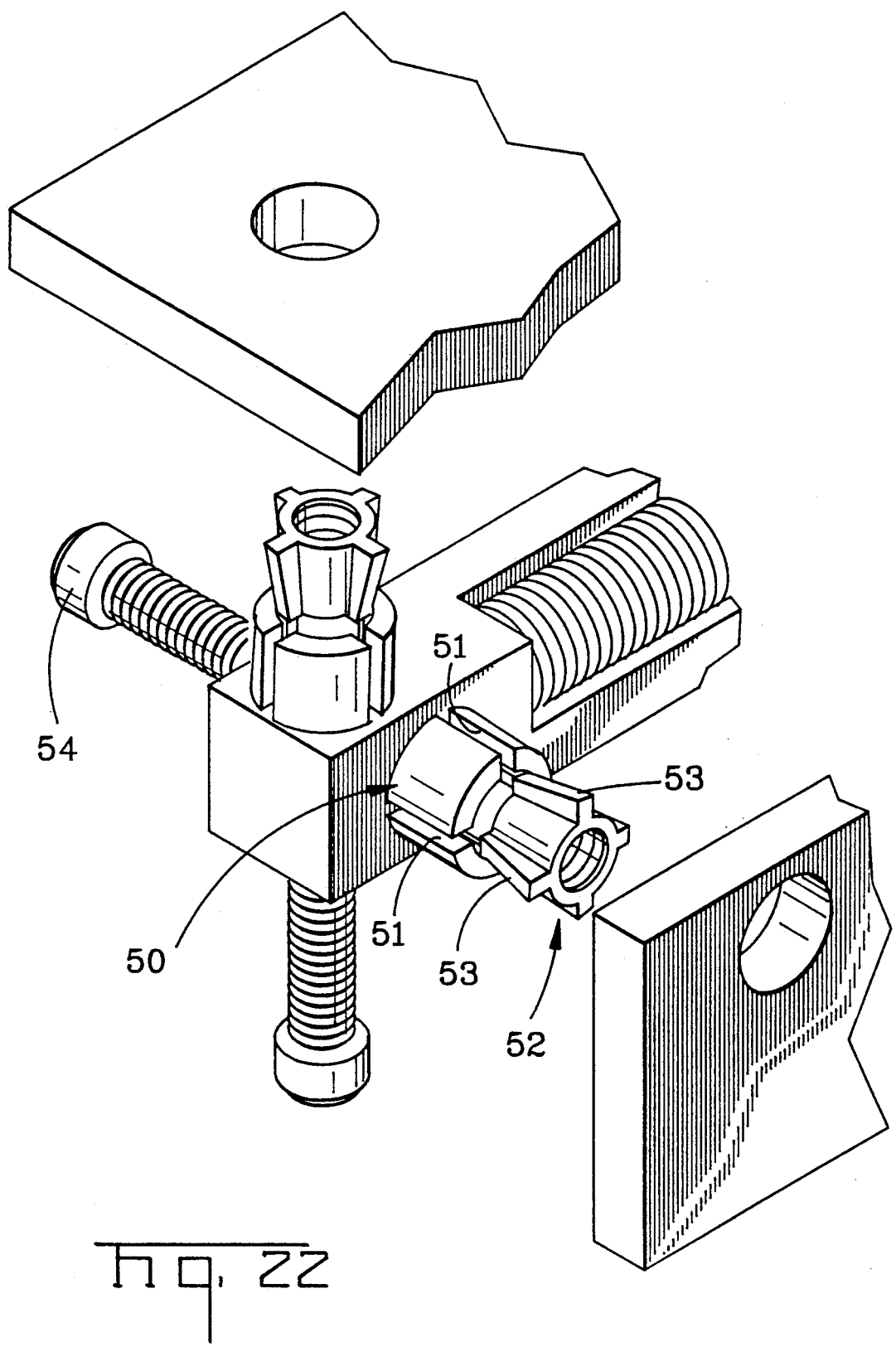
FIG. 22 is an exploded perspective of another embodiment of the present invention, wherein a fastener is integrally molded with the molded connector housing and extends through a mounting hole in a respective board to receive a conical nut, the conical nut having a plurality of circumferentially-spaced ears slidably received in a corresponding plurality of circumferentially-spaced slots in the fastener, such that a screw may be received through an opening in the molded connector housing and through the fastener to engage the conical nut.
Figure 23:
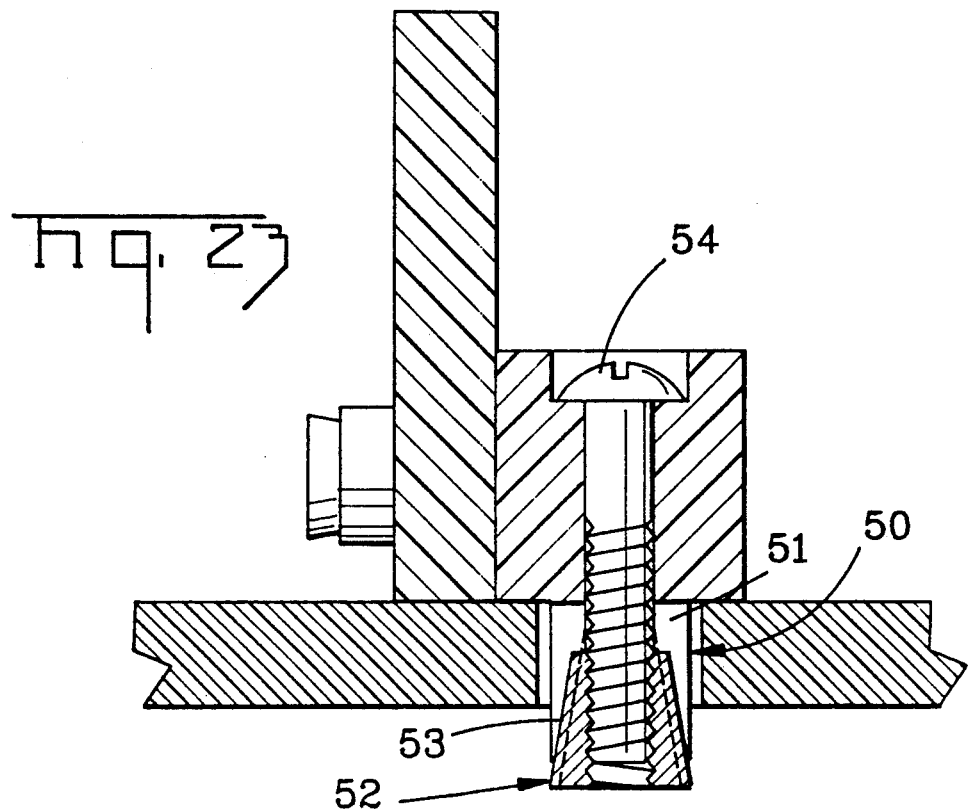
FIG. 23 is a cross-sectional view of the components of FIG. 22 in their pre-assembled relationship.
Figure 24:
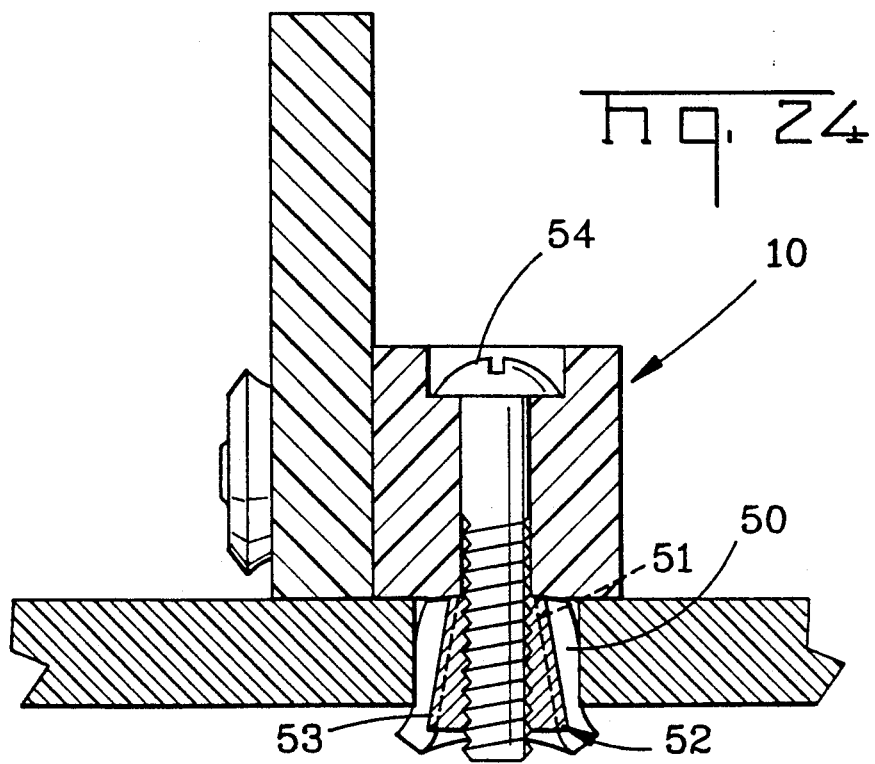
FIG. 24 is a further cross-sectional view, corresponding substantially to that of FIG. 23, but showing the screw tightened within the fastener to draw up the conical nut and spread the fastener apart to secure the molded connector housing to a respective board.
Figure 25:
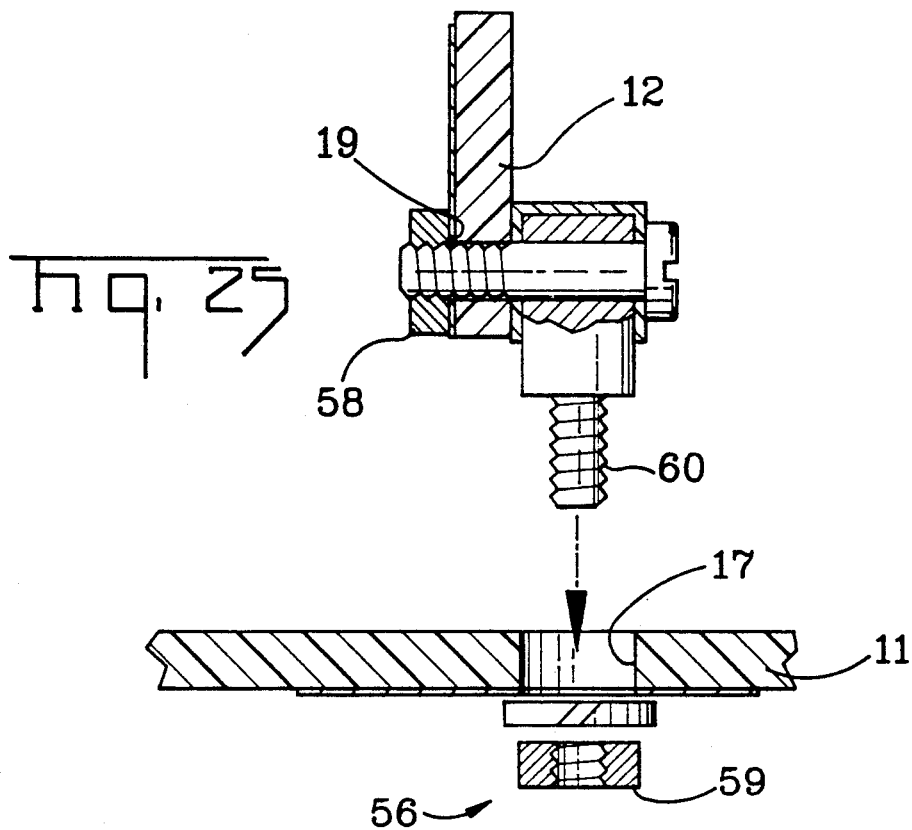
FIG. 25 is an exploded view of another embodiment, showing a metal mounting fixture and a screw received transversely in the metal mounting fixture.
Figure 26:
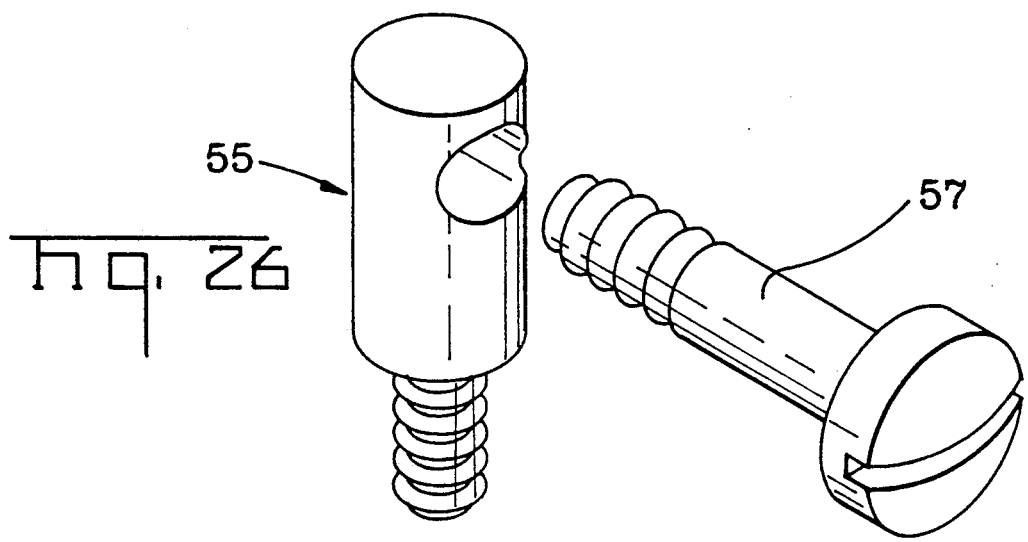
FIG. 26 is a cross-sectional view, showing the metal mounting fixture received within the molded connector housing and secured to a daughter board by means of the screw, and further showing a mother board with a washer and nut in exploded relationship.

With reference to FIGS. 22-24, a pair of right-angularly disposed internally-threaded fasteners 50 are integrally molded with the molded connector housing 10.

Each fastener 50 extends through its respective mounting hole 17, 19 in the boards 11, 12, respectively, and has a plurality of circumferentially-spaced slots 51 formed therein. A conical nut 52 is carried by the fastener 50 and has a corresponding plurality of circumferentially-spaced ears 53 received in the respective slots 51 in the fastener 50, and a screw 54 is received in each fastener 50. As the screw 54 is tightened in the fastener 50, the ears 53 on the conical nut 52 are drawn up into the slots 51 on the fastener 50, such that the fastener 50 is axially compressed and expanded radially (FIG. 24) to secure the molded connector housing 10 to the board 11 (or 12).

Figure 27:
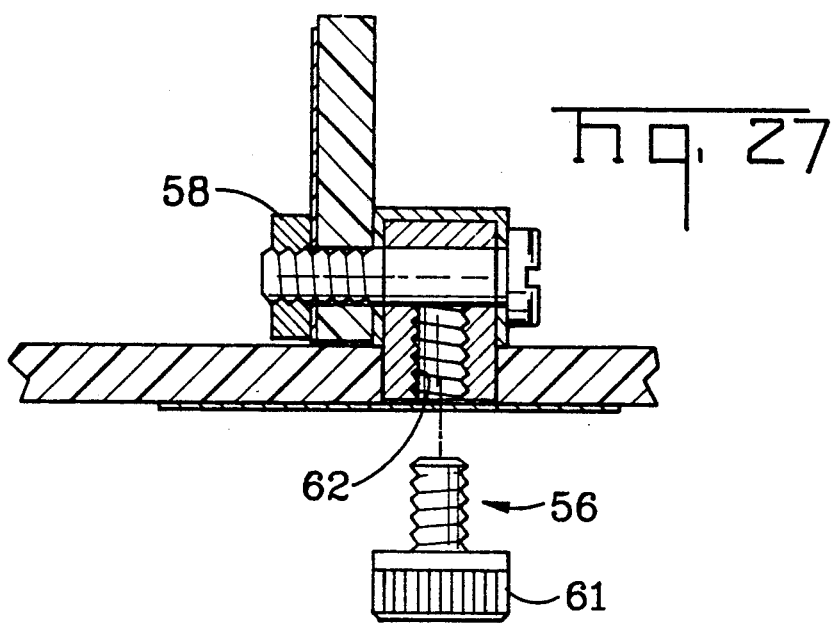
FIG. 27 is a further cross-sectional view, showing an alternate mounting fixture seated in the mounting hole in the board and having a tapped recess for receiving a screw.
Figure 28:
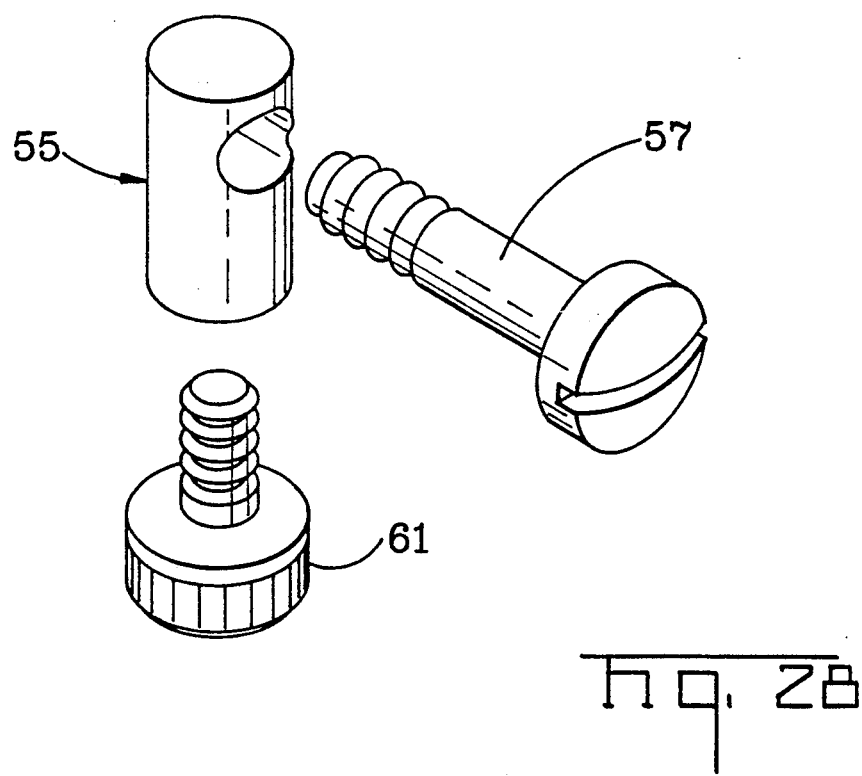
FIG. 28 is an exploded perspective of the alternate mounting fixture of FIG. 27, showing the respective screws.

With reference to FIGS. 25-28, a substantially cylindrical metallic mounting fixture 55 is nested between the mother and daughter boards (11, 12) and is seated in the mounting hole 17 in the mother board 11. A first metallic fastening means 56 is in contact with the heat sink 34 on the mother board 11 and engages the mounting fixture 55 axially thereof for securing the mounting fixture 55 to the mother board 11. A second metallic fastening means includes a screw 57 passing transversely through the mounting fixture 55 and through the mounting hole 19 in the daughter board 12. The screw 57 engages a nut 58 adjacent to the heat sink 36 on the daughter board 12. The first metallic fastening means 56 may include a nut 59 engaging a threaded stud 60 on the mounting fixtures 55 (FIGS. 25, 26) or else a screw 61 received in a tapped hole 62 in the mounting fixture 55' (FIG. 27, 28).

Obviously, many modifications may be made without departing from the basic spirit of the present invention. Accordingly, it will be appreciated by those skilled in the art that within the scope of the appended claims, the invention may be practiced other than has been specifically described herein.

We claim:

1. In an electronic assembly including a mother board having at least one circuit element thereon and further including a daughter board having at least one circuit element thereon, the improvement comprising:

a molded connector housing between the mother and daughter boards, a compressible electrical connector within the molded housing and electrically connecting the respective circuit elements on the mother and daughter boards, respectively, the mother board having at least one mounting hole formed therein, the daughter board having at least one mounting hole formed therein, and means including at least two pairs of latching fingers integrally molded with the molded connector housing and received within the respective mounting holes in the mother and daughter boards, respectively, for snapping the molded connector housing onto the mother and daughter boards, respectively.

2. The improvement of claim 1, wherein the compressible electrical connector comprises:

an elastomeric core, and a thin flexible film bonded to the elastomeric core.

3. The improvement of claim 1, wherein:

each pair of latching fingers includes complementary first and second fingers separated from each other and defining a space therebetween, each finger having a forward portion provided with an inclined surface and further provided with a notch rearwardly of its respective inclined surface, the respective inclined surfaces of the first and second fingers being directed opposite to each other and being disposed in respective planes defining therebetween a dihedral angle which converges in the direction of the respective board, such that as each pair of latching fingers enters its respective mounting hole, the respective inclined surfaces on the first and second fingers engage the mounting hole, thereby camming the first and second fingers inwardly towards each other, and such that as the respective inclined surfaces on the first and second fingers pass through the respective mounting hole, the fingers snap back into their normal position, such that the respective mounting hole is received within the respective notches in the first and second fingers, thereby latching the molded connector housing to its respective board.

4. The improvement of claim 3, wherein:

the molded connector housing further has an opening formed therein in communication with the space between the first and second fingers, and wherein:

a locking plunger is received within the opening in the molded connector housing and into the space between the first and second fingers.

5. The improvement of claim 4, wherein:

the molded connector housing further has an access opening formed therein at a right angle to the opening for the plunger, and wherein:

the locking plunger has a right-angularly bent portion received in the access opening in the molded connector housing.

6. The improvement of claim 5, wherein the molded connector housing further has an undercut therein in communication with the access opening, such that a tool may be inserted into the undercut to engage the right-angularly bent portion of the locking plunger to lift the locking plunger out of the molded connector housing.

7. The improvement of claim 1, wherein:

the pairs of latching fingers are offset with respect to each other in a direction longitudinally of the molded connector housing.

8. The improvement of claim 7, wherein:

each pair of latching fingers includes first and second fingers, the first and second fingers being offset with respect to each other in a direction longitudinally of the molded connector housing.

9. The improvement of claim 1, wherein:

the mother and daughter boards are substantially parallel to each other in a stacking configuration, and wherein:

the respective pairs of latching fingers are disposed substantially at 180° with respect to each other.

10. The improvement of claim 1, wherein:

the mother and daughter boards are substantially perpendicular to each other in an edge card configuration, and wherein:

the respective pairs of latching fingers are disposed substantially at 90° to each other.

11. The improvement of claim 1, wherein:

the mother and daughter boards have respective heat sinks, and wherein:

the pairs of latching fingers are made of metal and are insert molded within the molded connector housing, thereby connecting the respective heat sinks.

12. The improvement of claim 3, wherein:

the molded connector housing has an opening formed therein in communication with the space between the first and second fingers, and wherein:

a plunger is received in the opening in the molded connector housing, the plunger having a conical tip, such that the plunger may be depressed to engage and spread the first and second fingers apart.

13. The improvement of claim 12, wherein:

the plunger further has an enlarged head, a stem slidably received in the opening in the molded connector housing, and a collar between the enlarged head and the stem, and wherein:

the molded connector housing has a ledge upon which the collar of the plunger rests when the plunger is depressed, thereby limiting the movement of the plunger, and the molded connector housing further has an access opening formed therein adjacent to the ledge, such that a tool may be inserted into the access opening and beneath the enlarged head of the plunger to lift the plunger out of the molded connector housing.

14. In an electronic assembly having a pair of printed circuit boards disposed substantially parallel to each other, including a first board having at least one circuit element thereon, and further including a second board having at least one circuit element thereon, the improvement comprising:

a molded connector housing between the first and second boards, a compressible electrical connector within the molded connector housing and electrically connecting the respective circuit elements on the first and second boards, respectively, the molded connector housing having an opening formed therein, the second board having a mounting hole formed therein in communication with the opening in the molded connector housing, an axially-compressible grommet carried by the molded connector housing and extending through the mounting hole in the second board, the grommet having a forward slotted portion extending beyond the mounting hole in the second board, and a plunger within the grommet, such that the plunger may be depressed relative to the grommet to compress the grommet axially and draw the forward slotted portion of the grommet up against the second board.

15. The improvement of claim 14, wherein:

the molded connector housing further has a slotted recess, transversely of the opening formed therein and in communication therewith, and wherein:

the grommet further has a body portion including an intermediate section having an annular protrusion received within the slotted recess in the molded connector housing, such that as the grommet is positioned within the molded connector housing prior to the plunger being inserted into the grommet.

16. In an electronic assembly including a mother board having at least one circuit element thereon and further including a daughter board having at least one circuit element thereon, the improvement comprising:

a molded connector housing between the mother and daughter boards a compressible electrical connector within the molded connector housing and electrically connecting the respective circuit elements on the mother and daughter boards, respectively, at least one of the boards having at least one mounting hole formed therein, an internally-threaded fastener integrally molded with the molded connector housing, extending through the mounting hole in the one board, and having a plurality of circumferentially spaced slots formed therein, a conical nut carried by the fastener and having a corresponding plurality of circumferentially-spaced ears received in the respective slots in the fastener, and a screw received in the fastener, whereby, as the screw is tightened in the fastener, the ears on the conical nut are drawn up into the slots on the fastener, such that the fastener is axially compressed and expanded radially to secure the molded connector housing to the one board.

17. The improvement of claim 16, wherein:

the mother and daughter boards are disposed perpendicularly to each other, a pair of internally-threaded fasteners are integrally molded with the molded connector housing, one for each of the boards, and a pair of conical nuts are provided, one for each of the fasteners.

18. In an electronic assembly including a mother board and a daughter board disposed perpendicularly to each other in an edge card configuration, each of the boards having a heat sink, the improvement comprising:

a substantially cylindrical metallic mounting fixture nested between the mother and daughter boards, each of the boards having a mounting hole formed therein, the mounting fixture being seated in the mounting hole in the mother board, first metallic fastening means in contact with the heat sink on the mother board and engaging the mounting fixture axially thereof for securing the mounting fixture to the mother board, and second metallic fastening means including a screw passing transversely through the mounting fixture and through the mounting hole in the daughter board, and engaging a nut adjacent to the heat sink on the daughter board.

19. In an electronic assembly including a mother board and a daughter board having respective circuit elements and further having respective heat sinks, the improvement comprising:

a molded connector housing between the mother and daughter boards, a compressible electrical connector within the molded connector housing and electrically connecting the respective circuit elements on the mother and daughter boards, a metallic mounting fixture carried by the molded connector housing, first metallic fastening means securing the mounting fixture to the mother board and contacting the respective heat sink therein, and second metallic fastening means securing the mounting fixture to the daughter board and contacting the respective heat sink therein.

* * * * *